United States Patent
Hasegawa et al.

(10) Patent No.: US 8,941,237 B2
(45) Date of Patent: *Jan. 27, 2015

(54) SEMICONDUCTOR DEVICE

(71) Applicant: Elpida Memory, Inc., Tokyo (JP)

(72) Inventors: Yu Hasegawa, Tokyo (JP); Mitsuaki Katagiri, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 13/920,520

(22) Filed: Jun. 18, 2013

(65) Prior Publication Data

US 2013/0277835 A1 Oct. 24, 2013

Related U.S. Application Data

(63) Continuation of application No. 13/192,065, filed on Jul. 27, 2011, now Pat. No. 8,487,433.

(30) Foreign Application Priority Data

Jul. 29, 2010 (JP) .................................. 2010-170557

(51) Int. Cl.
*H01L 23/498* (2006.01)
*H01L 23/538* (2006.01)
(Continued)

(52) U.S. Cl.
CPC .......... *H01L 23/49811* (2013.01); *H01L 23/13* (2013.01); *H01L 24/48* (2013.01); *H01L 24/49* (2013.01); *H01L 24/83* (2013.01); *H01L 24/85* (2013.01); *H01L 24/97* (2013.01); *H01L 25/0657* (2013.01); *H01L 23/538* (2013.01); *H01L 2224/48091* (2013.01); *H01L 2224/4813* (2013.01); *H01L 2224/4824* (2013.01); *H01L 2224/48465* (2013.01); *H01L 2224/48471* (2013.01); *H01L 2224/48479* (2013.01); *H01L 2224/4911* (2013.01); *H01L 2224/49175* (2013.01); *H01L 2224/49426* (2013.01); *H01L 2224/73215* (2013.01); *H01L 2224/73265* (2013.01); *H01L 2224/78301* (2013.01); *H01L 2224/83192* (2013.01); *H01L 2224/85051* (2013.01); *H01L 2224/85186* (2013.01); *H01L 2224/92147* (2013.01); *H01L 2224/97* (2013.01);
(Continued)

(58) Field of Classification Search
USPC .......... 257/686, 737, 777, 782, 784, E23.068, 257/E23.142, E23.169, E23.17
See application file for complete search history.

(56) References Cited

U.S. PATENT DOCUMENTS 5,777,391 A 7/1998 Nakamura et al.
6,097,098 A * 8/2000 Ball .............................. 257/786
(Continued)

FOREIGN PATENT DOCUMENTS

JP 2008-198841 8/2008

*Primary Examiner* — Peniel M Gumedzoe
(74) *Attorney, Agent, or Firm* — Young & ThompsonPS4

(57) ABSTRACT

A device includes a substrate, a semiconductor chip, first and second pads, and a first wiring layer. The substrate includes first and second surfaces. The semiconductor chip includes third and fourth surfaces. The third surface faces toward the first surface. The first and second pads are provided on the third surface. The first and second pads are connected to each other. The first wiring layer is provided on the second surface of the substrate. The first wiring layer is connected to the first pad.

17 Claims, 7 Drawing Sheets

(51) Int. Cl.
*H01L 23/13* (2006.01)
*H01L 23/00* (2006.01)
*H01L 25/065* (2006.01)

(52) U.S. Cl.
CPC .............. *H01L 2225/0651* (2013.01); *H01L 2225/06558* (2013.01); *H01L 2924/01029* (2013.01); *H01L 2924/01079* (2013.01); *H01L 2924/01082* (2013.01); *H01L 2924/014* (2013.01); *H01L 2924/15311* (2013.01); *H01L 2224/2919* (2013.01); *H01L 2924/01005* (2013.01); *H01L 2924/01033* (2013.01); *H01L 2924/0665* (2013.01); *H01L 2224/32145* (2013.01); *H01L 2224/32225* (2013.01); *H01L 2224/48227* (2013.01); *H01L 24/78* (2013.01)
USPC ........... 257/737; 257/686; 257/777; 257/782; 257/784; 257/E23.068; 257/E23.142; 257/E23.169

(56) References Cited

U.S. PATENT DOCUMENTS

| | | | |
|---|---|---|---|
| 6,218,202 | B1 | 4/2001 | Yew et al. |
| 6,380,635 | B1 * | 4/2002 | Manning et al. ............... 257/784 |
| 2003/0111716 | A1 * | 6/2003 | Ano ............................... 257/678 |
| 2007/0075440 | A1 | 4/2007 | Osanai et al. |

* cited by examiner

SEMICONDUCTOR DEVICE

CROSS REFERENCE TO RELATED APPLICATIONS

This application is a continuation of application Ser. No. 13/192,065 filed on Jul. 27, 2011, which claims foreign priority to Japanese application No. 2010-170557 filed on Jul. 29, 2010. The entire contents of each of the above applications are hereby incorporated by reference.

BACKGROUND OF THE INVENTION

1. Field of the Invention

The present invention generally relates to a semiconductor device and a method of forming the same.

Priority is claimed on Japanese Patent Application No. 2010-170557, Jul. 29, 2010, the content of which is incorporated herein by reference.

2. Description of the Related Art

BGA (Ball Grid Array) semiconductor packages, CSP (Chip Size Package) type semiconductor packages, and the like have been generally known as examples of semiconductor devices in the related art. These semiconductor packages include a substrate on which a semiconductor chip is mounted. The semiconductor chip and the substrate are connected by a wire bonding process or the like.

Japanese Unexamined Patent Application, First Publication, No. JP-A-2008-198841 discloses a BGA semiconductor device including the following elements. A semiconductor chip includes a chip pad. A package substrate includes an opening through which the chip pad is shown. A bonding pad is provided at one end of a package wiring located on the package substrate. A solder ball is provided on the other end of the package wiring. The chip pad and the bonding pad are electrically connected via a bonding wire.

SUMMARY

In one embodiment, a device may include, but is not limited to, a substrate, a semiconductor chip, first and second pads, and a first wiring layer. The substrate includes first and second surfaces. The semiconductor chip includes third and fourth surfaces. The third surface faces toward the first surface. The first and second pads are provided on the third surface. The first and second pads are connected to each other. The first wiring layer is provided on the second surface of the substrate. The first wiring layer is connected to the first pad.

In another embodiment, a device may include, but is not limited to, a substrate, a first semiconductor chip, first and second electrode pads, a first wire, a first wiring layer, and a second wire. The substrate has a penetrating opening. The substrate includes first and second surfaces. The first semiconductor chip includes third and fourth surfaces. The first semiconductor chip is mounted over the substrate so that the third surface faces toward the first surface. The first and second electrode pads are provided on the third surface. The first and second electrode pads are positioned in the penetrating opening in plan view. The first and second electrode pads are configured to have the same electric potential. The first wire couples the first and second electrode pads. The first wiring layer is provided on the second surface. The second wire couples the second electrode pad and the first wring layer through the penetrating opening.

In still another embodiment, a semiconductor device may include, but is not limited to, a wiring board, a semiconductor chip, a first wire, and a second wire. The wiring board includes a bonding pad thereon. The semiconductor chip includes first and second electrode pads thereon. The semiconductor chip is mounted over the wiring board. The first wire includes a first end part of the first wire. The first wire is bonded above the first electrode pad to electrically couple the first electrode pad and the second electrode pad. The second wire includes a second end part of the second wire. The second wire is bonded above the first end part of the first wire to electrically couple the first electrode pad and the bonding pad.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
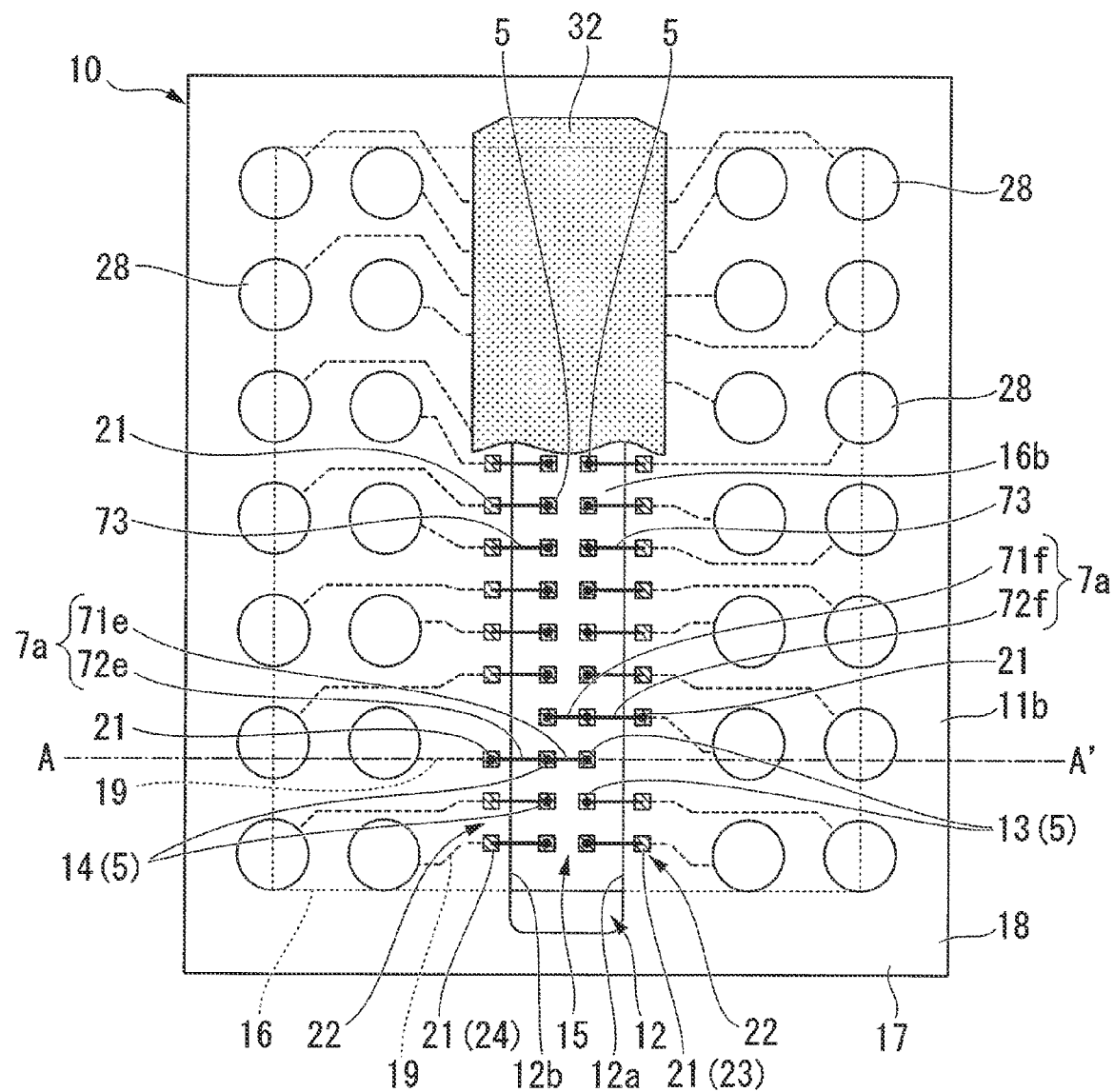
FIG. 1 is a plan view illustrating a rear surface of a semiconductor device in accordance with one embodiment of the present invention.

Before describing the present embodiment of the present invention, the related art will be explained in order to facilitate the understanding of the present embodiment of the present invention.

Wire routing of the package wirings over the package substrate may be difficult in the semiconductor device in the related art. Also, the package wirings may be long in the related art. Miniaturization of the semiconductor device has been difficult since a large space for the package wirings must be secured.

The number of solder balls is restricted in the semiconductor device disclosed by Japanese Unexamined Patent Application, First Publication, No. JP-A-2008-198841. Additionally, the number of the package wirings located between the solder balls is restricted since the wiring layer which forms the package wirings is a single layer. Therefore, wire routing of the package wirings over the package substrate has been difficult and been a circuitous route.

Japanese Unexamined Patent Application, First Publication, No. JP-A-2008-198841 discloses the related art which is directed to the semiconductor device including the following elements. Two lines of the chip pads are connected to the bonding pads via the bonding wires. The bonding pads connected to the chip pads are located in the vicinity of an adjacent side of the opening to the bonding pads. Two lines of the chip pads are positioned in the opening of the package substrate in plan view seen vertical to the package substrate. A method of easier wire routing of the package wirings over the package substrate disclosed by Japanese Unexamined Patent Application, First Publication, No. JP-A-2008-198841 may be given as follows by improving the degree of freedom of a package wiring arrangement over the package substrate. A method is given of bonding the chip pad to the bonding pad, which is located in the vicinity of a far side of the opening from the bonding pad, via the bonding wire.

However, when the chip pad is connected to the bonding pad, which is located in the vicinity of the far side of the opening from the bonding pad, via the bonding wire, the bonding wire connecting the chip pad and the bonding pad should be long. Accordingly, a short circuit or the like may occur because of a movement of the bonding wire, which can be caused by flow of a sealing resin while sealing the opening or the like.

Embodiments of the invention will now be described herein with reference to illustrative embodiments. Those skilled in the art will recognize that many alternative embodiments can be accomplished using the teachings of the embodiments of the present invention and that the invention is not limited to the embodiments which are illustrated for explanatory purposes.

In one embodiment, a device may include, but is not limited to, a substrate, a semiconductor chip, first and second pads, and a first wiring layer. The substrate includes first and second surfaces. The semiconductor chip includes third and fourth surfaces. The third surface faces toward the first surface. The first and second pads are provided on the third surface. The first and second pads are connected to each other. The first wiring layer is provided on the second surface of the substrate. The first wiring layer is connected to the first pad.

In some cases, the device may include, but is not limited to, the substrate including a penetrating opening. The first and second pads are positioned in the penetrating opening in plan view.

In some cases, the device may further include, but is not limited to, a first wire coupling the first pad and the second pad and a second wire coupling the first pad and the first wiring layer.

In some cases, the device may further include, but is not limited to, a first bonding pad provided on the second surface. The first bonding pad is coupled to the first wiring. The second wire is coupled through the penetrating opening to the first bonding pad. The first bonding pad is closer to the first pad than the second pad.

In some cases, the device may further include, but is not limited to, a plurality of pads including the first and second pads, a plurality of bonding pads including the first bonding pad, and a plurality of wiring layers including the first wiring layer. Each the plurality of wiring layers are provided with a corresponding one of the plurality of bonding pads. The number of the pads is greater than the number of the bonding pads and greater than the number of the wiring layers.

In some cases, the device may further include, but is not limited to, a second wiring layer provided on the second surface and a third electrode pad provided on the third surface. The third electrode pad is coupled to the second wiring layer. The third electrode pad is positioned between the first and second electrode pads.

In another embodiment, a device may include, but is not limited to, a substrate, a first semiconductor chip, first and second electrode pads, a first wire, a first wiring layer, and a second wire. The substrate has a penetrating opening. The substrate includes first and second surfaces. The first semiconductor chip includes third and fourth surfaces. The first semiconductor chip is mounted over the substrate so that the third surface faces toward the first surface. The first and second electrode pads are provided on the third surface. The first and second electrode pads are positioned in the penetrating opening in plan view. The first and second electrode pads are configured to have the same electric potential. The first wire couples the first and second electrode pads. The first wiring layer is provided on the second surface. The second wire couples the second electrode pad and the first wring layer through the penetrating opening.

In some cases, the device may further include, but is not limited to, a first bonding pad provided on the second surface. The second wire is coupled through the first bonding pad to the first wiring layer. The first bonding pad is farther from the first electrode pad than the second electrode pad.

In some cases, the device may further include, but is not limited to, a sealant filling the penetrating opening. The sealant seals the first and second electrode pads, the first bonding pad, and the first and second wires.

In some cases, the device may further include, but is not limited to, a second semiconductor chip, third and fourth electrode pads, and a second wiring layer. The second semiconductor chip includes fifth and sixth surfaces. The second semiconductor chip is stacked over the first semiconductor chip so that the sixth surface faces the fourth surface. The third and fourth electrode pads are provided on the fifth surface. The third and fourth electrode pads are coupled to each other. The third and fourth electrode pads are configured to have the same electric potential. The second wiring layer is provided on the first surface. The fourth electrode pad is coupled to the second wiring layer.

In some cases, the device may further include, but is not limited to, a third wire coupling the third and fourth electrode pads and a fourth wire coupling the fourth electrode pad and the second wiring layer.

In some cases, the device may further include, but is not limited to, a second bonding pad provided on the first surface. The fourth wire is coupled through the second bonding pad to the second wiring layer. The second bonding pad is farther from the third electrode pad than the fourth electrode pad.

In some cases, the device may further include, but is not limited to, a third bonding pad and a fifth electrode pad. The third bonding pad is provided on the second surface. The fifth electrode pad is provided on the third surface. The fifth electrode pad is coupled to the third bonding pad. The fifth electrode pad is positioned between the first and second electrode pads.

In some cases, the device may further include, but is not limited to, a sixth electrode pad provided between the first and second electrode pads. The sixth electrode pad is uncoupled to the first and second electrode pads.

In still another embodiment, a semiconductor device may include, but is not limited to, a wiring board, a semiconductor chip, a first wire, and a second wire. The wiring board includes a bonding pad thereon. The semiconductor chip includes first and second electrode pads thereon. The semiconductor chip is mounted over the wiring board. The first wire includes a first end part of the first wire. The first wire is bonded above the first electrode pad to electrically couple the first electrode pad and the second electrode pad. The second wire includes a second end part of the second wire. The second wire is bonded above the first end part of the first wire to electrically couple the first electrode pad and the bonding pad.

In some cases, the device may further include, but is not limited to, a bump provided on the first electrode pad of the semiconductor chip. The first end part of the first wire is bonded above the first electrode pad via the bump.

In some cases, the device may include, but is not limited to, the wiring board including a penetrating opening. The semiconductor chip is mounted over the wiring board so that the first and second electrode pads are positioned in the penetrating opening in plan view. The second wire couples the first electrode pad and the bonding pad through the penetrating opening.

In some cases, the device may include, but is not limited to, the semiconductor chip including first and second surfaces opposed to each other and side surfaces joined to the first and second surfaces. The semiconductor chip is mounted over the wiring board so that the second surface faces the wiring board. The first and second electrode pads are provided on the first surface. The second wire connects the first electrode pads and the bonding pad along an associated one of the side surfaces.

In some cases, the device may include, but is not limited to, the first electrode pad being positioned near the bonding pad than the second electrode pad.

In some cases, the device may include, but is not limited to, the second electrode pad being positioned near the first electrode pad than the bonding pad. The first wire is shorter than the second wire.

Hereinafter, a semiconductor device according to an embodiment of the invention will be described in detail with reference to the drawings. The invention is not limited thereto and may be appropriately modified within a scope which does not deviate from the concept of the invention. The thickness, dimensions, and the like of each element described in the drawings may be different from those in the semiconductor device.

First Embodiment

Figure 2:
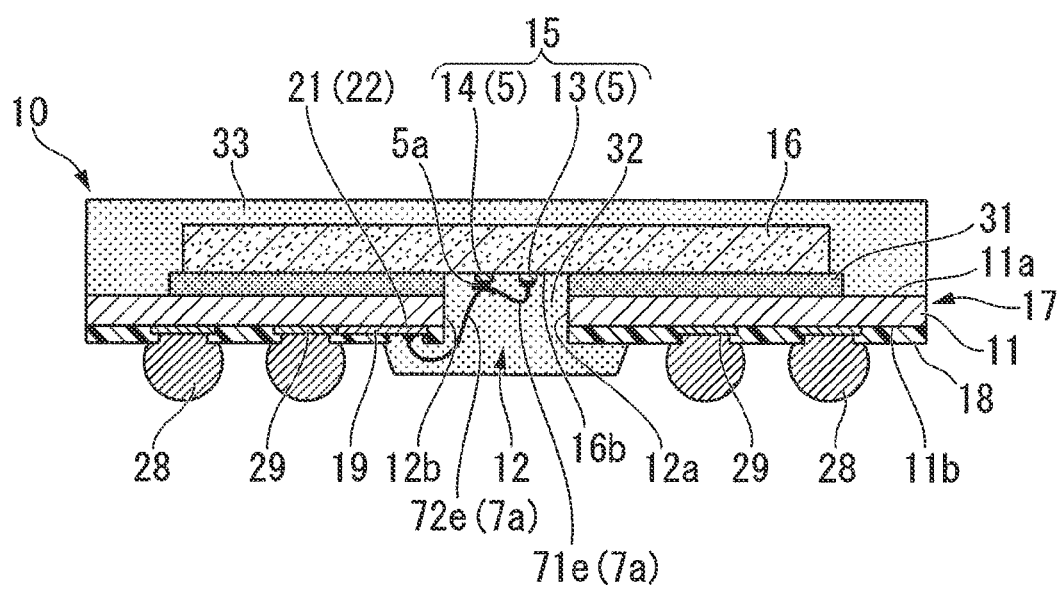
FIG. 2 is a cross sectional elevation view, taken along an A-A' line of FIG. 1, illustrating the semiconductor device in accordance with one embodiment of the present invention.

FIGS. 1 and 2 illustrate a semiconductor device according to one embodiment of the present invention. FIG. 1 is a plan view illustrating a rear surface of a semiconductor device in accordance with one embodiment of the present invention. FIG. 2 is a cross sectional elevation view, taken along an A-A' line of FIG. 1, illustrating the semiconductor device in accordance with one embodiment of the present invention.

A semiconductor device 10 illustrated in FIGS. 1 and 2 is a BGA type semiconductor device. The semiconductor device 10 may include, but is not limited to, a wiring board 17 (substrate), a semiconductor chip 16, and a connector 7a as shown in FIG. 2.

The wiring board 17 may include, but is not limited to, an opening 12 and wiring layers 19 which are partly uncovered by an insulating film 18 as shown in FIGS. 1 and 2. The wiring board 17 has a first surface 11a and a second surface 11b. The opening 12 penetrates the wiring board 17 from the first surface 11a to the second surface 11b. The opening 12 is substantially rectangular in plan view when the wiring board 17 is seen in a vertical direction. The opening 12 is provided substantially in a center portion of the wiring board 17 in plan view when the wiring board 17 is seen in a vertical direction. The opening 12 has a first side wall 12a and a second side wall 12b which faces toward the first side wall 12a.

The wiring board 17 may includes, but is not limited to, a substantially rectangular insulating substrate 11 when the wiring board 17 is seen in a vertical direction. The substantially rectangular insulating substrate 11 may be, for example, a glass epoxy substrate with a thickness of 0.2 mm. The insulating substrate 11 is not limited to the glass epoxy substrate. For example, the insulating substrate 11 may be a flexible wiring board using a polyimide substrate.

A plurality of wiring layers 19 are arranged in predetermined patterns on the insulating substrate on the second surface 11b which is opposed to the first surface 11a where the semiconductor chip 16 is provided (a rear surface of the insulating substrate 11 in FIG. 2). The wiring layers 19 include a conductive material such as copper. Each of the wiring layers 19 is partially covered by the insulating film 18 which includes a solder resist material or the like.

As shown in FIGS. 1 and 2, a bonding pad group 22 including a plurality of bonding pads 21 (bond fingers) is located on the second surface 11b of the wiring board 17. The plurality of bonding pads 21 are located at first ends of the wiring layers 19 which are uncovered by the insulating film 18. The plurality of bonding pads 21 are connected to the wiring layers 19.

The bonding pad group 22 includes first and second bonding pad lines 23 and 24 as shown in FIG. 1. The first bonding pad line 23 includes a first sub-plurality of bonding pads 21 which are located along the first side wall 12a of the opening 12. The second bonding pad line 24 includes a second sub-plurality of bonding pads 21 which are located along the second side wall 12b of the opening 12.

The wiring board 17 is divided into two regions, a first region on the first side wall 12a and a second region on the second side wall 12b, by the opening 12. Solder balls 28 (external electrodes) are arranged in matrix with predetermined intervals in each of the first and second regions on the second surface 11b as shown in FIG. 1. The solder balls 28 are electrically connected to lands 29 (external connection terminals) which are located at second ends of the wiring layers 19 which are uncovered by the insulating film 18.

As shown in FIG. 2, the semiconductor chip 16 is mounted on the wiring board 17 on the first surface 11a of using a fixing member 31 such as a DAF (Die Attached Film) or elastomers.

The semiconductor chip 16 is substantially rectangular. The semiconductor chip 16 is the form of the plate. A memory circuit (not shown) and an electrode pad array 15 are located on a rear surface 16b of the semiconductor chip 16 in FIG. 2. The electrode pad array 15 is formed by a plurality of electrode pads 5. The rear surface 16b faces toward the first surface 11a of the wiring board 17. A passivation film (not shown) is provided on the rear surface 16b of the semiconductor chip 16 excluding regions of electrode pads 5. The electrode pads 5 form the electrode pad array 15. The passivation film protects the rear surface 16b on which the memory circuit is formed.

As shown in FIGS. 1 and 2, the semiconductor chip 16 is positioned so that the rear surface 16b on which the electrode pad array 15 is located faces toward the wiring board 17. The semiconductor chip 16 is positioned so that the electrode pad array 15 is positioned in the opening 12 of the wiring board 17 in plan view when the wiring board 17 is seen in a vertical direction as shown in FIGS. 1 and 2. According to the present embodiment, the electrode pad array 15 is formed by the plurality of electrode pads 5 as shown in FIGS. 1 and 2. The electrodes pads 5 are arranged in two lines substantially in the center of the semiconductor chip 16. As shown in FIG. 1, the electrode pad array 15 includes a first line of first electrode pads 13 and a second line of second electrode pads 14. The first line of first electrode pads 13 includes a first sub-plurality of the electrode pads 5. The second line of first electrode pads 14 includes a second sub-plurality of the electrode pads 5. The plurality of the electrode pads 5 includes the first and second sub-pluralities of the electrode pads 5. The first line of first electrode pads 13 are arranged along or in the vicinity of the first side wall 12a of the opening 12. The second line of first electrode pads 14 are arranged along or in the vicinity of the second side wall 12b of the opening 12.

According to the semiconductor device 10 illustrated in FIGS. 1 and 2, the electrode pad array 15 includes two or more electrode pads 5 which are configured to have the same electric potential. Among the electrode pads 5 forming the electrode pad array 15, there may be two or more of the electrode pads 5 which are configured to have the same electric potential, but is not limited to a specific number.

According to the present embodiment, as shown in FIGS. 1 and 2, two of the electrode pads 5 which are the first electrode pad 13 and the second electrode pad 14 are connected to the bonding pad 21 via a connector 7a. Two of the electrode pads 5 are configured to have the same electric potential. Each bonding pad 21 is located at the first end of a corresponding wring layer 19 on the wiring board 17. Each bonding pad 21 is connected to a corresponding wring layer 19 on the wiring board 17.

In other cases, three or more of the electrode pads 5 which are configured to have the same electric potential may be connected via the connector 7a to one end of a corresponding wiring layer 19 on the wiring board 17.

According to the present embodiment, as shown in FIGS. 1 and 2, the connector 7 formed by a first wire 71e and a second wire 72e connects the first electrode pad 13 which is the third from the bottom in FIG. 1 and the second electrode pad 14 which is the third from the bottom in FIG. 1. The connector 7a formed by a first wire 71f and a second wire 72f connects the first electrode pad 13 which is the fourth from the bottom in FIG. 1 and the second electrode pad 14 which is the fourth from the bottom in FIG. 1.

According to the semiconductor device 10 illustrated in FIGS. 1 and 2, the first electrode pad 13 and the second electrode pad 14 configured to have the same electric potential, which are connected to each other via the connector 7a, are connected to a power supply or are grounded. It is preferable that the electrode pads 5 connected to each other via the connector 7a are connected to the power supply or are grounded, but is not limited thereto. As long as the electrode pads 5 connected to each other via the connector 7a are configured to have the same electric potential, the electrode pads 5 may be unconnected to the power supply or be grounded.

The connector 7a may include, the first wire 71e and the second wire 72e, or the first wire 71f and the first wire 72f as shown in FIGS. 1 and 2. Each of the first wires 71e and 71f electrically connects two of the electrode pads 5 in the opening 12. The first wires 71e and 71f may include, but is not limited to, Au, Cu, or the like. Each of the second wires 72e and 72f electrically connects one of two electrode pads 5 and the bonding pad 21. The second wires 72e and 72f may include, but is not limited to, Au, Cu, or the like.

As shown in FIG. 2, an end of the second wire 72e is connected to the electrode pad 5 via a bump 5a. The bump 5a may include the same material as the first wires 71e and 71f. The bump 5a may include, but is not limited to, Au, Cu, or the like.

As shown in FIG. 1, the electrode pad 5 which is positioned at an end of the connector 7a is farther from the first end of the wiring layer 19 than the other electrode pad 5 which is connected to the connector 7a.

For example, the first electrode pad 13 which is the third from the bottom in FIG. 1 is farther from the bonding pad 21 than the second electrode pad 14 which is the third from the bottom in FIG. 1. The bonding pad 21 is located at the first end of the wiring layer 19. The bonding pad 21 is connected to the wiring layer 19.

The first electrode pad 13 which is the fourth from the bottom in FIG. 1 is farther from the bonding pad 21 than the second electrode pad 14 which is the fourth from the bottom in FIG. 1. The bonding pad 21 is located at the first end of the wiring layer 19. The bonding pad 21 is connected to the wiring layer 19.

According to the present embodiment, as shown in FIG. 1, the distance between the electrode pad 5 positioned at the end of connector 7a and the first end of wiring layer 19 adjacent to the electrode pad 5 positioned at the end of connector 7a is longer than the distance between the electrode pad 5 positioned at the end of connector 7a and other electrode pad 5 which is connected to the electrode pad 5 positioned at the end of connector 7a via the first wire 71e (or first wire 71 0.

For example, the distance between the first electrode pad 13 which is the third from the bottom in FIG. 1 and the first end of the wiring layer 19 which is the second or third from the bottom in FIG. 1 is longer than the distance between the first electrode pad 13 which is the third from the bottom in FIG. 1 and the second electrode pad 14 which is the third from the bottom in FIG. 1. The second electrode pad 14 is electrically connected to the first electrode pad 13 via first wire 71e.

According to the present embodiment, for example, compared to the case where the electrode pad 5 connected to the end of the connector 7a is connected to the wiring layer 19 adjacent to the electrode pad 5 via a wire, a shorter wire can be used without using a longer wire. A short circuit of the first wires 71e and 71f caused by the movement of the first wires 71e and 71f can be prevented, which leads to easier formation of the semiconductor device 10. The first wires 71e and 71f can be moved by the flow of a sealing resin in the formation of a sealant 32 in the opening 12 and the vicinity thereof. The sealant 32 may include the sealing resin. According to the semiconductor device 10 shown in FIGS. 1 and 2, the connector 7a does not have branches. The first electrode pad 13 and the second electrode pad 14 are connected in series to the bonding pad 21 via the first wire 71e (or the firs wire 710 and the second wire 72e (or the second wire 720. In this case, the area of the bonding pad 21 is not required to be larger than in the related art even if the first electrode pad 13 is connected to the second electrode pad 14 via the connector 7a. The semiconductor device 10 can be miniaturized.

For example, when two of the electrode pads 14 are connected to the bonding pad in parallel via two wires, the bonding pad should have an area sufficient to connect the two wires to the bonding pad, which may lead to an expansion of the area of the bonding pad. According to the semiconductor device 10 illustrated in FIGS. 1 and 2, two electrode pads 5 which are configured to have the same electric potential are connected in series via the connector 7a. However, the present embodiment is not limited thereto as long as the connector 7a connects two or more of the electrode pads 5 to the first end of the wiring layer 19. For example, the connector 7a may connect two or more of the electrode pads 5, which are configured to have the same electric potential, to the first end of the wiring layer 19 in parallel. In this case, the number of the wiring layers 19 can be reduced compared to the number of the electrode pads 5. Thereby, the degree of freedom of the arrangement of the wiring layers 19 can be improved.

Among the first electrode pads 13 illustrated in FIG. 1, the first electrode pads 13 which are unconnected to the connector 7a are electrically connected to the adjacent bonding pads 21 of the first bonding pad line 23 via wires 73, respectively. The wire 73 may include, but is not limited to, Au, Cu, or the like. Among the second electrode pads 14, the second electrode pads 14 which are unconnected to the connector 7a are electrically connected to the adjacent bonding pads 21 of the second bonding pad line 24 via the wires 73.

Each of the electrode pads 5 which is unconnected to the connector 7a is connected to the closest bonding pad 21 located at the first end of the wiring layer 19 via the wire 73.

According to the semiconductor device 10 illustrated in FIGS. 1 and 2, the sealant 32 including the sealing resin is formed in the opening 12 and in the vicinity of the opening 12. The first wires 71e and 71f, the second wires 72e and 72f, and the wires 73 are sealed by the sealant 32. According to the semiconductor device 10 illustrated in FIGS. 1 and 2, a connection portion of the semiconductor chip 16 and the wiring board 17 provided with the 71e and 71f, the second wires 72e and 72f, and the wires 73 are protected from the outside by providing the sealant 32.

A region of the semiconductor chip 16, which does not face toward the wiring board 17, is covered by the sealant 33 including the sealing resin. According to the semiconductor device 10 illustrated in FIGS. 1 and 2, the semiconductor chip 16 is protected from the outside by providing the sealant 33.

The sealing resin used for the sealants 32 and 33 may include, but is not limited to, thermosetting resins such as epoxy resins or the like.

Method of Forming the Semiconductor Device

FIGS. 3A through 3F are fragmentary cross sectional elevation views, taken along the A-A' line of FIG. 1, illustrating the semiconductor device in a step involved in a method of forming the semiconductor device 10 of FIG. 1 in accordance with the first embodiment of the present invention. FIGS. 4A through 4D are fragmentary cross sectional elevation views illustrating the semiconductor device 10 in a step involved in the process illustrated in FIG. 3C in accordance with the first embodiment of the present invention. The same parts as those of the semiconductor device 10 in the first embodiment are denoted by the same reference numerals in FIGS. 3A through 4D.

Figure 3A:
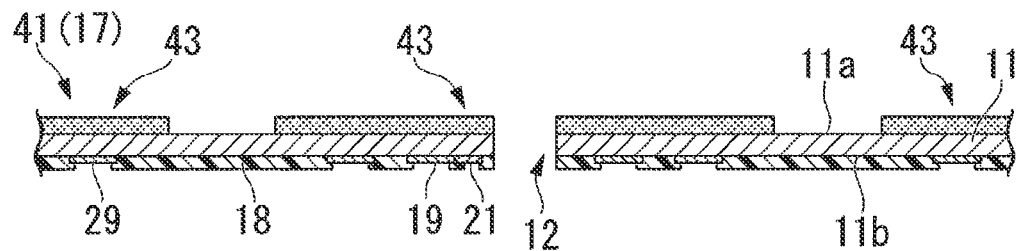
FIG. 3A is a fragmentary cross sectional elevation view, taken along the A-A' line of FIG. 1, illustrating the semiconductor device in a step involved in a method of forming the semiconductor device of FIG. 1 in accordance with one embodiment of the present invention.

The method of forming the semiconductor device 10 illustrated in FIGS. 1 and 2 may include, but is not limited to, the following processes. A substrate for the wiring board 17 is prepared. As shown in FIG. 3A, a wiring motherboard 41 (the wiring board 17) is provided with product formation units 43 which are arranged in a matrix. The openings 12 are formed in each the product formation units 43 to penetrate the wiring motherboard 41 from the first surface 11a to the second surface 11b. The wiring layers 19 are formed on the wiring motherboard 41. The first end of the wiring layer 19 is uncovered by the insulating film 18. The wiring motherboard 41 according to the present embodiment is processed by MAP (Mold Array Process). The plurality of product formation units 43 are arranged in matrix.

Each the product formation units 43 will be the wiring boards 17 illustrated in FIGS. 1 and 2 by dicing the wiring motherboard 41 in the later process.

A frame (not shown) is provided in the vicinity of the product formation units 43 which are arranged in matrix. The frame has positioning holes (not shown) at a given interval for handling and positioning.

According to the present embodiment, the plurality of wiring layers 19 are formed over the wiring motherboard 41 (wiring board 17) on the second surface 11b in the process of forming the wiring motherboard 41 (wiring board 17) as shown in FIG. 3A. The wiring layers 19 are electrically connected to the solder balls 28. The wiring layers 19 are partially covered by the insulating film 18. The insulating film 18 may include, but is not limited to, the solder resist. The first ends of the wiring layers 19 which are uncovered by the insulating film 18 are the bonding pads 21. The second ends of the wiring layers 19 which are uncovered by the insulating film 18 are the lands 29.

Figure 3B:
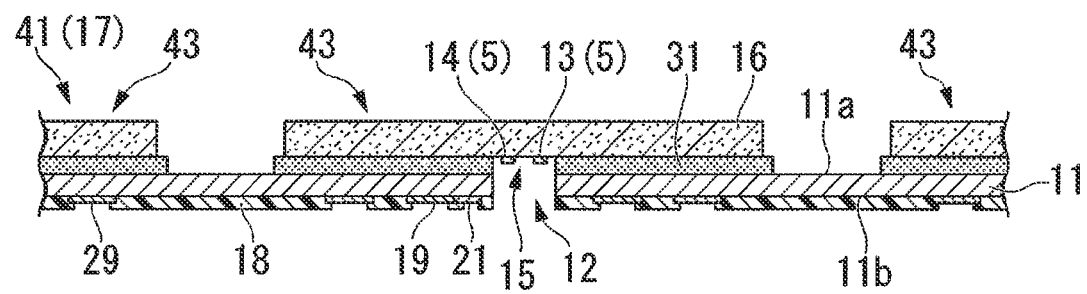
FIG. 3B is a fragmentary cross sectional elevation view, taken along the A-A' line of FIG. 1, illustrating the semiconductor device in a step, subsequent to the step of FIG. 3A, involved in a method of forming the semiconductor device of FIG. 1 in accordance with one embodiment of the present invention.

As shown in FIG. 3B, the semiconductor chip 16 is mounted on each of the product formation units 43 provided on the wiring motherboard 41 on the first surface 11a. Each of the product formation units will be the wiring substrate 17. The semiconductor chip 16 includes the electrode pad array 15 constituted by two or more of the electrode pads 5 which are configured to have the same electric potential, as shown in FIG. 1. The semiconductor chip 16 is positioned so that the electrode pad array 15 is positioned in the opening 12 when the semiconductor chip 16 is seen in a vertical direction. The semiconductor chip 16 is fixed by the fixing member 31 such as the DAF so that the semiconductor pad array 15 of the semiconductor chip 16 faces toward the wiring board 17.

FIG. 3B describes the first electrode pad 13 and the second electrode pad 14, which are located on A-A' of FIG. 1, among the plurality of the electrode pads 5.

Figure 3C:
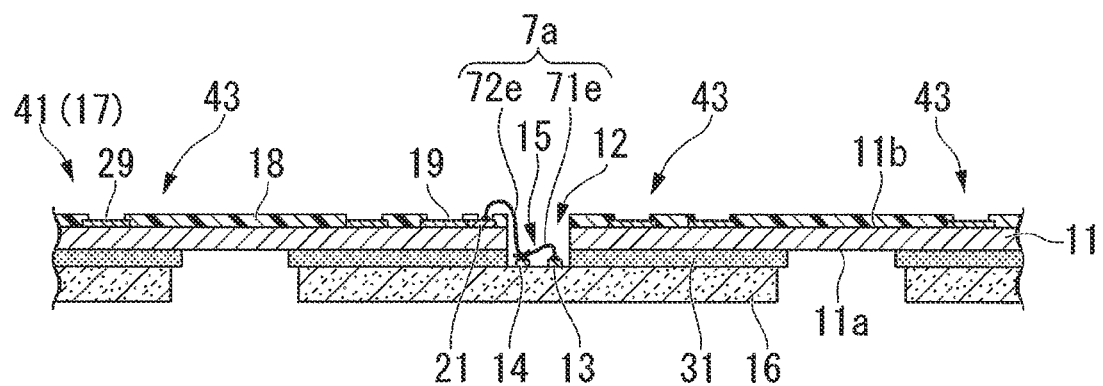
FIG. 3C is a fragmentary cross sectional elevation view, taken along the A-A' line of FIG. 1, illustrating the semiconductor device in a step, subsequent to the step of FIG. 3B, involved in a method of forming the semiconductor device of FIG. 1 in accordance with one embodiment of the present invention.

As shown in FIG. 3C, a process of bonding the connector 7a to the first end of the wiring layer 19 (the bonding pad 21) and two or more of the electrode pads 5 which are configured to have the same electric potential. The wiring layer 19 is located over the wiring board 17. The bonding process is performed so that, among the two or more of the electrode pads 5 which will be bonded to the connector 7a, the electrode pad 5 which is the farthest from the wiring layer 19 is located at an end of the connector 7a. In the FIG. 3C, the electrode pad 5 which is the farthest from the wiring layer 19 is the first electrode pad 13.

The wiring board 17 may be placed so that the second surface 11b is up with respect to the ground in the bonding process as shown in FIG. 3C.

When the first electrode pad 13, the second electrode pad 14, and the bonding pad 21 are connected via the first wire 71e and the second wire 72e in the bonding process, there can be used a capillary 70 of a wire bonding apparatus shown in FIGS. 4A through 4D, for example. A wire whose end is melted to be in a ball shape is bonded to the first electrode pad 13, the second electrode pad 14, or the bonding pad 21 by thermosonic bonding.

Figure 4A:
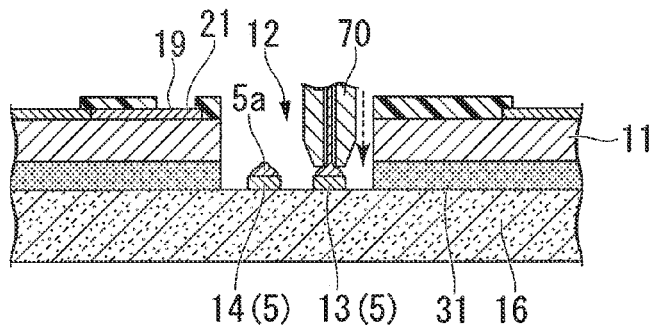
FIG. 4A is a fragmentary cross sectional elevation view illustrating the semiconductor device in a step involved in the process illustrated in FIG. 3C in accordance with one embodiment of the present invention.
Figure 4B:
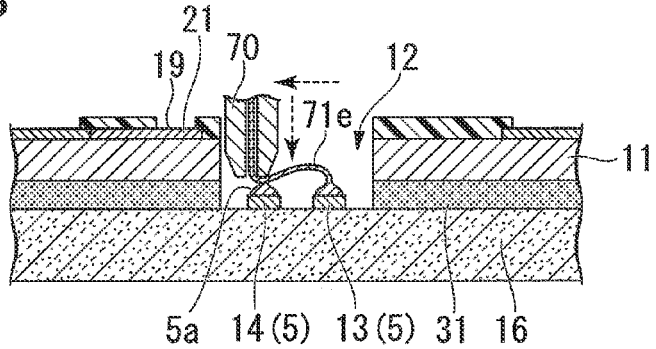
FIG. 4B is a fragmentary cross sectional elevation view illustrating the semiconductor device in a step, subsequent to the step of FIG. 4A, involved in the process illustrated in FIG. 3C in accordance with one embodiment of the present invention.

According to the present embodiment, in the bonding process, there is firstly performed a first bonding process in which the first electrode pad 13 is electrically connected to the second electrode pad 14 via the first wire 71e as shown in FIGS. 4A and 4B.

According to the present embodiment, as shown in FIG. 4A, a bump 5a is formed on an electrode pad 5 which will be connected to the second wire 72e before the first bonding process (bump formation process). The electrode pad 5 which will be connected to the second wire 72e is the second electrode pad 14 in FIG. 4A.

The bump 5a may be, but is not limited to, formed by the following processes. A wire whose end is melted to be in a ball shape is bonded to the second electrode pad 14 by thermosonic bonding by using the capillary 70 of the wire bonding apparatus. After that, the wire is cut.

When the bump 5a is formed in this manner, the first bonding process can be started smoothly after forming the bump 5a, which enhances the formation of the semiconductor device 10.

The bump 5a may be formed by plating or the like.

When the bump 5a is formed before the first bonding process, the reliability of an electrical connection between the second electrode pad 14 and the first wire 71e can be improved without an expansion of the area of the second electrode pad 14.

As described in the present embodiment, the bump 5a may be formed on the second electrode pad 14 before the first bonding process, but is not limited thereto. The first wire 71e may be bonded directly to the second electrode pad 14 in the first bonding process without forming the bump 5a on the second electrode pad 14.

In the first bonding processes, as shown in FIG. 4A, the first wire 71e is bonded, using the capillary 70 of the wire bonding apparatus, to the first electrode pad 13 which will be unconnected to the second wire 72e in a second bonding process. As shown in FIG. 4B, the capillary 70 is moved so that the first wire 71e forms a predetermined loop shape (curved shape). The first wire 71e is bonded to the second electrode pad 14, to which the second wire 72e will be bonded, via the bump 5a.

The first wire 71e which connects the first electrode pad 13 and the second electrode pad 14 is formed by cutting an end of the first wire 71e. The first electrode pad 13 and the second electrode pad 14 are electrically connected to each other via the first wire 71e.

Figure 4C:
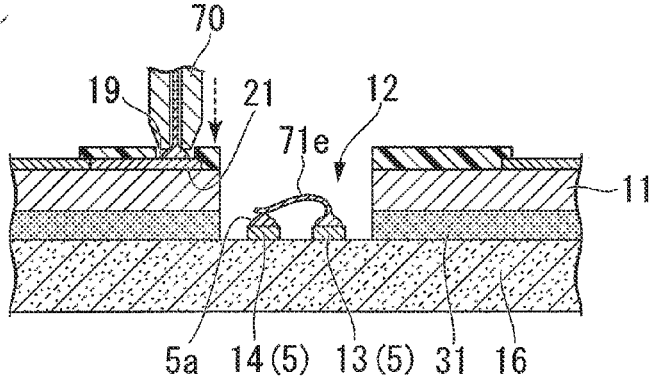
FIG. 4C is a fragmentary cross sectional elevation view illustrating the semiconductor device in a step, subsequent to the step of FIG. 4B, involved in the process illustrated in FIG. 3C in accordance with one embodiment of the present invention.
Figure 4D:
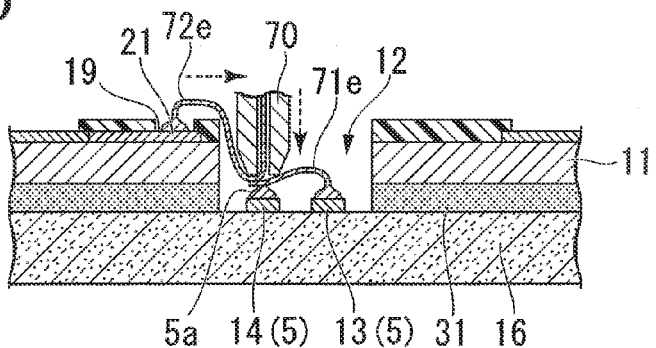
FIG. 4D is a fragmentary cross sectional elevation view illustrating the semiconductor device in a step, subsequent to the step of FIG. 4C, involved in the process illustrated in FIG. 3C in accordance with one embodiment of the present invention.

As shown in FIGS. 4C and 4D, the second bonding process is performed. In the second bonding process, the second electrode pad 14 which is closer to the wiring layer 19 than the first electrode pad 13 (refer to FIG. 1) is electrically connected to the bonding pad 21 via the second wire 72e.

According to the second bonding process, among the first electrode pad 13 and the second electrode pad 14 which are configured to have the same electric potential, the first electrode pad 13 is positioned at an end of the connector 7a. The first electrode pad 13 is the electrode pad 5 which is farther from the wiring layer 19 than the second electrode pad 14.

In the second bonding process, as shown in FIG. 4C, the second wire 72e is bonded to the bonding pad 21 using the capillary 70 of the wire bonding apparatus. As shown in FIG. 4D, the second wire 72e is bonded to part of the first wire 71e, which is bonded to the second electrode pad 14, by moving the capillary 70 so that the second wire 72e forms a predetermined loop shape. The second wire 72e overlaps the part of the first wire 71e which is bonded to the second electrode pad 14.

The second wire 72e which connects the bonding pad 21 and the second electrode pad 14 is formed by cutting an end of the second wire 72e. The first and second electrode pads 13 and 14 and the bonding pad 21 are electrically connected to each other via the first and second wires 71e and 72e.

Among the electrode pads 5, the electrode pads 5 which are unconnected to the connector 7a are connected to the bonding pads 21, which are positioned at ends of the wiring layers 19 via the wires 73. The bonding pads 21 which is connected to the electrode pad 5 via the wire 73 is nearest the electrode pad 5.

Bonding the electrode pads 5 which are unconnected to the connector 7a and the bonding pad 21 may be performed in the same manner as the second bonding process. The wire 73 is bonded to the bonding pad 21 by the capillary 70 of the wire bonding apparatus. Then, the wire 73 is bonded to the electrode pad 5 by moving capillary 70 so that the wire 73 forms a predetermined loop shape. In this case, the wire 73 can be formed in the loop with lower height compared to the case where the electrode pad 5 is bonded to the wire 73, and then the wire 73 is bonded to the bonding pad 21.

Figure 3D:
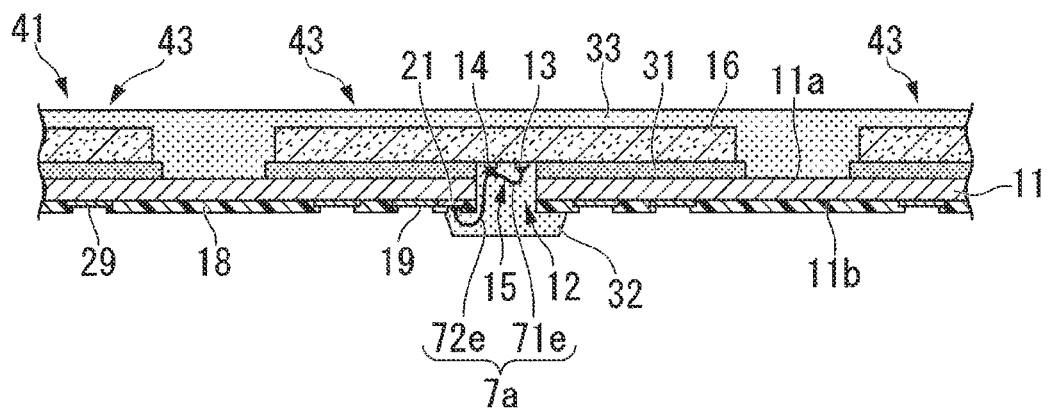
FIG. 3D is a fragmentary cross sectional elevation view, taken along the A-A' line of FIG. 1, illustrating the semiconductor device in a step, subsequent to the step of FIG. 3C, involved in a method of forming the semiconductor device of FIG. 1 in accordance with one embodiment of the present invention.

As shown in FIG. 3D, the sealant 32 is formed in the opening 12 and in the vicinity of the opening 12, thereby sealing the first and second wires 71e and 72e and the wire 73. The sealant 32 includes the sealing resin. The sealant 33 is formed to cover a region of the semiconductor chip 16 which does not face toward the wring board 17.

Figure 3E:
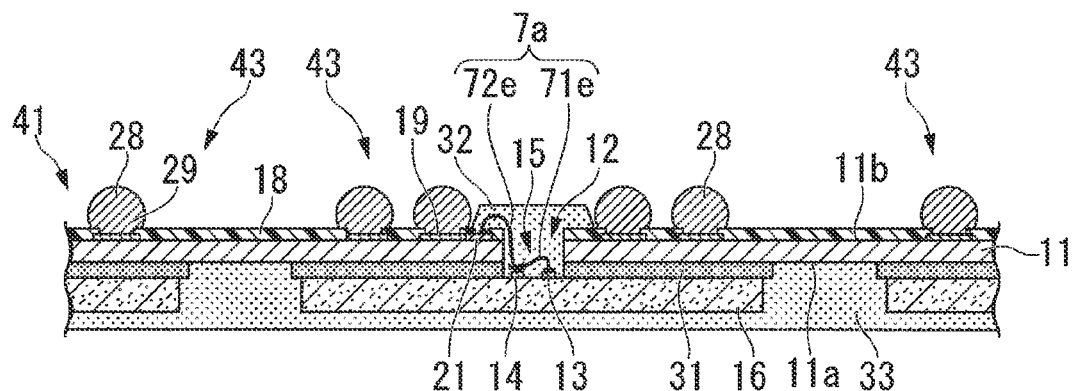
FIG. 3E is a fragmentary cross sectional elevation view, taken along the A-A' line of FIG. 1, illustrating the semiconductor device in a step, subsequent to the step of FIG. 3D, involved in a method of forming the semiconductor device of FIG. 1 in accordance with one embodiment of the present invention.

As shown in FIG. 3E, the solder ball 28 is formed to be electrically connected to the land 29. The land 29 is the second end of the wiring layer 19, which is uncovered by the insulating film 18. When the plurality of solder balls 28 are formed, a method using a ball mounting tool may be used. The ball mounting tool has a plurality of suction holes. The plurality of suction holes are located in positions corresponding to the positions where the lands 29 will be formed. The solder balls 9 are held by the suction holes of the ball mounting tool. Then, a flux is transferred to the held solder balls 28. Then, the solder balls 28 are collectively mounted on the land 29. The wring motherboard 41 is reflowed at a predetermined temperature to fix the solder balls 28.

The wiring motherboard 41 is divided into the element formation units 43. Specifically, the wiring mother board 41 is horizontally and vertically diced on dicing lines by a dicing blade into pieces of the element formation units 43. The wiring motherboard 41 is divided into the wiring boards 17. As shown in FIGS. 1 and 2, the semiconductor device 10 can be obtained.

Figure 3F:
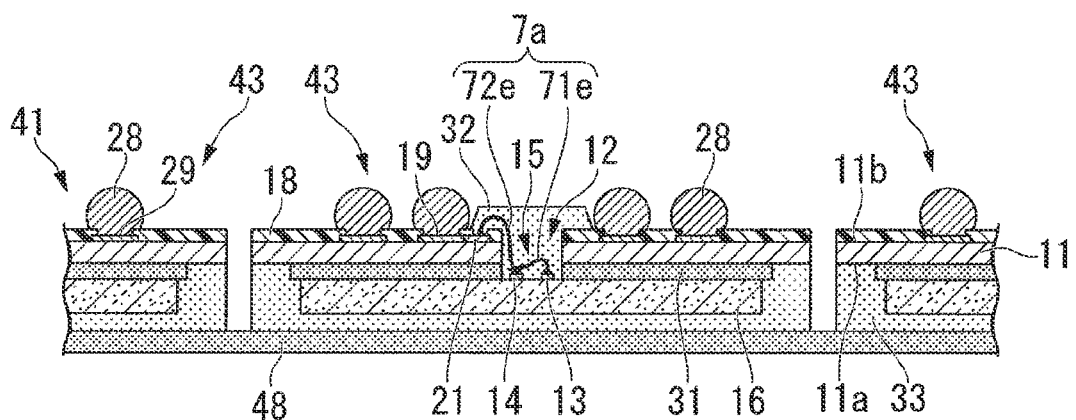
FIG. 3F is a fragmentary cross sectional elevation view, taken along the A-A' line of FIG. 1, illustrating the semiconductor device in a step, subsequent to the step of FIG. 3E, involved in a method of forming the semiconductor device of FIG. 1 in accordance with one embodiment of the present invention.

When the wiring motherboard 41 is diced, the dicing tape 48 may be adhered to the sealant 33 covering the semiconductor chip 16 as shown in FIG. 3F. The wiring motherboard 41 may be fixed on the dicing tape 48 and diced.

According to the present embodiment, the semiconductor device 10 may include, but is not limited to, the wiring board 17, the semiconductor chip 16, and the connector 7a. The wiring board 17 having the opening 12 may include, but is not limited to the wiring layer 19. The opening 12 penetrates the wiring board 17 from the first surface 11a to the second surface 11b. The opening 12 is substantially rectangular in plan view when the wiring board 17 is seen in a vertical direction. The first end of the wiring layer 19 is uncovered by the insulating film 18. The semiconductor chip 16 may include, but is not limited to, the electrode pad array 15. The electrode pad array 15 includes two or more of the electrode pads 5 which are configured to have the same electric potential. The two or more of the electrode pads 5 which are configured to have the same electric potential are provided on the first surface 11a of the wiring board 17. The two or more of the electrode pads 5 which are configured to have the same electric potential are positioned in the opening 12 when the wiring board 17 is seen in a vertical direction. The connector 7a connects the two or more of the electrode pads 5 which are configured to have the same electric potential. The connector 7a is connected to the one end of the wiring layer 19 which arranged over the wiring board 17. According to this configuration, the number of wiring layers 19 with respect to the electrode pads 5 can be reduced. There can be improved the degree of freedom of the arrangement of the wiring layers 19 on the wiring board 17. The semiconductor device 10 can be miniaturized.

According to the semiconductor device 10 of the present embodiment, the electrode pad 5 connected to the end of the connector 7a is farther from the first end of the wiring layer 19 than the other electrode pad 5 which is connected to the connector 7a. In this case, the connector 7a can be shortened compared to the case where the electrode pad 5 connected to the end of the connector 7a is closer to the first end of the wiring layer 19 than the other electrode pad 5 connected to the connector 7a. The short circuit or the like can be prevented in the first wire 71e and/or the second wire 72e which constitute the connector 7a. The short circuit may be caused by the movement of the first wire 71e and/or the second wire 72e or the like. The first wire 71e and/or the second wire 72e can be moved by the flow of the sealing resin in the formation of the sealant 32 in or in the vicinity of the opening 12. Therefore, the semiconductor device 10 can be formed easier than the semiconductor device in the related art.

According to the present embodiment, the semiconductor device 10 may include, but is not limited to, the wiring layer 19 over the wiring board 17 which is a single layer. The wiring layer 19 can be formed easier than a multiple-layer wiring. The productivity of the semiconductor device 10 can be improved. The cost of the semiconductor device 10 can be reduced.

According to the method of forming the semiconductor device 10 of the present embodiment, the two or more of the electrode pads 5 which are configured to have the same electric potential are connected to the first end of the wiring layer 19 arranged over the wiring board 17 via the connector 7a. The number of wiring layers 19 with respect to the electrode pads 5 can be reduced, and the degree of freedom of the arrangement of the wiring layers 19 over the wiring board 17 can be improved.

According to the method of forming the semiconductor device 10 of the present embodiment, the first and second bonding processes are performed as follows. The first bonding process may include, but is not limited to, the following process. The first wire 71e is bonded to the electrode pad 5 which will be unconnected to the second wire 72e in the second bonding process. Then, the first wire 71e is bonded to the electrode pad 5 which will be connected to the second wire 72e. The second bonding process may include, but is not limited to, the following process. The second wire 72e is bonded to the bonding pad 21. Then, the second wire 72e is bonded to the part of the first wiring 71e which on the electrode pad 5, which is bonded to the electrode pad 5. Therefore, it is not necessary to individually secure a region for bonding the first and second wires 71e and 72e, and the semiconductor device can be miniaturized.

According to the method for forming the semiconductor device 10 of the present embodiment, the second bonding process may include the following processes. The second wire 72e is bonded to the bonding pad 21. Then, the second wire 72e is bonded to the part of the first wiring 71e which is bonded to the electrode pad 5. The height of the second wire 72e which protrudes from a surface of the wiring board 17 on the first surface 11b can be reduced compared to the case where the second wire 72e is bonded to the first wire 71e on the electrode pad 5, and then the second wire 72e is bonded to the bonding pad 21, for example.

Second Embodiment

Figure 5:
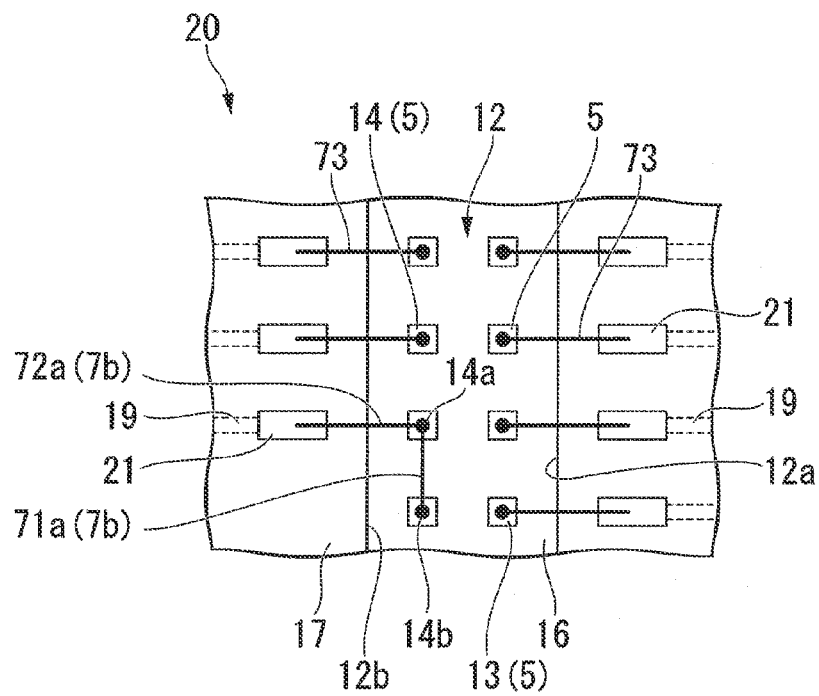
FIG. 5 is a fragmentary plan view illustrating a rear surface of a semiconductor device in accordance with another embodiment of the present invention.

FIG. 5 illustrates a fragmentary plan view illustrating a rear surface of a semiconductor device in accordance with the second embodiment of the present invention.

A semiconductor device 20 illustrated in FIG. 5 is different from the semiconductor device 10 illustrated in FIG. 1 on the following elements. The electrode pad 5 which are configured to have the same electric potential are second electrode pads 14a and 14b adjacent to each other. The second electrode pad 14a and 14b adjacent to each other are connected to the bonding pad 21 which is located at the first end of the wiring layers 19 via a first L shaped connector 7b. The wiring layer 19 is arranged over the wiring board 17. First and second wires 71a and 72a constitute the first L shaped connector 7b.

The same parts as those of the semiconductor device 10 in the first embodiment are denoted by the same reference numerals in the drawings and their descriptions are omitted. The semiconductor device 20 illustrated in FIG. 5 can be formed in the same manner as the semiconductor device 10 illustrated in FIG. 1.

The semiconductor device 20 illustrated in FIG. 5 may include, but is not limited to, the first L shaped connector 7b (the first and second wires 71a and 72a) similar to the semiconductor device 10. The first L shaped 7b connects two or more of the electrode pads 5 which are configured to have the same electric potential and the first end of the wiring layer 19 which is arranged over the wiring board 17. The number of the wiring layers 19 with respect to the number of the electrode pads 5 can be reduced, and a similar effect as the semiconductor device 10 illustrated in FIG. 1 can be obtained.

Third Embodiment

Figure 6:
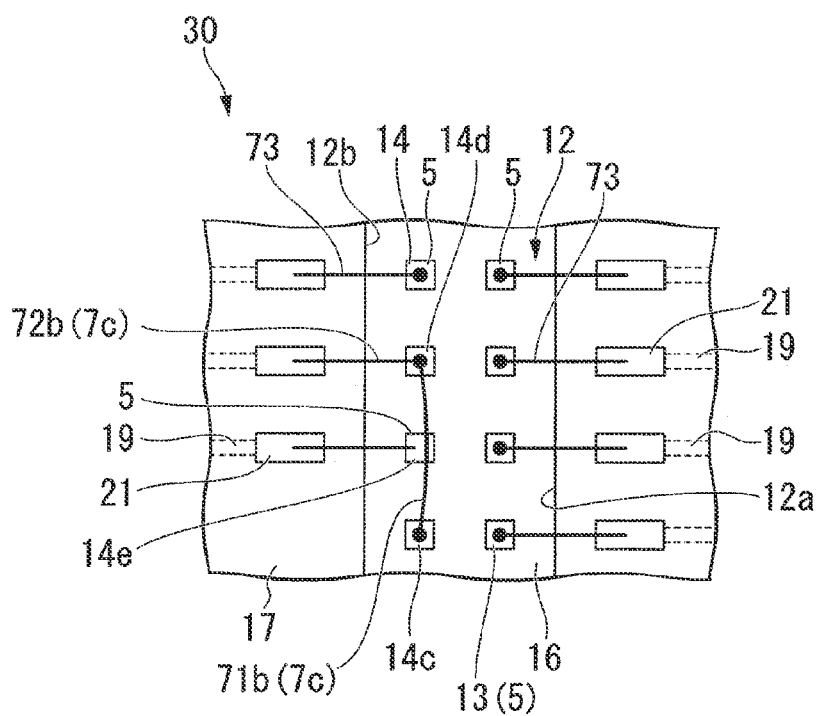
FIG. 6 is a fragmentary plan view illustrating a rear surface of a semiconductor device in accordance with still another embodiment of the present invention.

FIG. 6 is a fragmentary plan view illustrating a rear surface of a semiconductor device in accordance with the third embodiment of the present invention.

The semiconductor device 30 illustrated in FIG. 6 is different from the semiconductor device 10 illustrated in FIG. 1 on the following elements. The electrode pads 5 which are configured to have the same electric potential are second electrode pads 14c and 14d. A first electrode pad 14e is arranged between the second electrode pads 14c and 14d. The second electrode pads 14c and 14d between which the first electrode pad 14e is arranged are connected to the bonding pad 21 via a second L shaped connector 7c. First and second wires 71b and 72b constitute the second L shaped connector 7c. The bonding pad 21 is located at the first end of the wiring layer 19 over the wiring board 17. The bonding pad 21 is connected to the wiring layer 19. The same parts as those of the semiconductor device 10 in the first embodiment are denoted by the same reference numerals in the drawings and their descriptions are omitted.

A method of forming the semiconductor device 30 illustrated FIG. 6 may include, but is not limited to, the following processes. The processes before the first bonding process are conducted in the same manner as the semiconductor device 10 illustrated in FIG. 1. In the first bonding processes, the first wire 71b is bonded to the second electrode pad 14c, which will be unconnected to the second wire 72b by using the capillary 70 of the wire bonding apparatus. Then, the capillary 70 is moved so that the first wire 71b crosses over the first electrode pad 14e and forms a predetermined loop shape (curved shape). As shown in FIG. 6, the first wire 71b is bonded to the second electrode pad 14d to which the second wire 72b will be bonded via the bump 5a (not shown in FIG. 6).

The first wire 71b connecting the second electrode pads 14c and 14d is formed by cutting an end of the first wire 71b. The second electrode pads 14c and 14d are electrically connected to each other via the first wire 71b.

After that, the second bonding process and the processes subsequent thereto are performed in the same manner as the semiconductor device 10 illustrated in FIG. 1.

According to the present embodiment, the first electrode pad 14e is positioned between the second electrode pads 14c and 14d which are configured to have the same electric potential. Among the electrode pads 5, the first electrode pad 14e may be connected to the bonding pad 21 which is located at the first end of the wiring layer 19 closest to the first electrode pad 14e by the wire 73 before connecting the second electrode pads 14c and 14d by the first wire 71b.

When the first electrode pad 14e is connected to the bonding pad 21 which is located at the first end of the wiring layer 19 closest to the first electrode pad 14e by the wire 73, the wire 73 may be bonded to the bonding pad 21, then the wire 73 may be bonded to the electrode pad 5 in the same manner as the second bonding process in the first embodiment.

In this case, the wire 73 is formed in a loop shape with smaller height than in the related art. According to the first bonding process of the present embodiment, the first wire 71b is bonded to the second electrode pad 14c, then the first wire 71b with a predetermined loop shape (curved shape) crossing over the second electrode pad 14e can be easily bonded to the second electrode pad 14d.

The semiconductor device 30 illustrated in FIG. 6 may include, but is not limited to, the first electrode pad 14e and the second electrode pads 14c and 14d. There may be two ore more of the second electrode pads 14c and 14d. The second electrode pads 14c and 14d are the electrode pads 5 configured to the same electric potential. There may be two or more of the first electrode pad 14e. The first electrode pad 14e is positioned between the second electrode pads 14c and 14d. The semiconductor device 30 illustrated in FIG. 6 may include, but is not limited to, the second L shaped connector 7c in a similar way to the semiconductor device 10 illustrated FIG. 1. The second L shaped connector 7c connects two or more of the electrode pads 5 and one end of the wiring layer 19. The wiring layer 19 is arranged over the wiring board 17. The number of wiring layers 19 with respect to the electrode pads 5 can be reduced. A similar effect as the semiconductor device 10 illustrated in FIG. 1 can be obtained.

Specifically, two of the electrode pads 5 configured to the same electric potential are the second electrode pads 14c and 14d in the semiconductor device 30 illustrated in FIG. 6. The first electrode pad 14e is positioned between the second electrode pads 14c and 14d. The second electrode pads 14c and 14d are connected to each other by the first wire 71b of the second L shaped connector 7c crossing over the first electrode pad 14e. The second electrode pad 14d is connected to the first end of the wiring layer 19 by the second wire 72b of the second L shaped connector 7c. Even when two or more of the electrode pads 5 which are configured to have the same electric potential are not adjacent to each other, the number of the wiring layers 19 with respect to the number of the electrode pads 5 can be reduced.

According to the semiconductor device 30 of the present embodiment, even when two or more of the electrode pads 5 are not adjacent to each other, the number of the wiring layers 19 with respect to the number of the electrode pads 5 can be reduced in a similar way as when the two or more of the electrode pads 5 are adjacent to each other according to the first and second embodiments. The degree of freedom of arrangement of the electrode pads 5 on the semiconductor chip 16 can be improved.

According to the third embodiment, the following example is shown. One electrode pad 5 is positioned between two of the electrode pads 5 which are configured to have the same electric potential. The two or more of the electrode pads 5 which are configured to have the same electric potential are connected by the first wire 71b, which is the second L-shaped connector 7c, crossing over the one electrode pad 5. However, the present embodiment is not limited thereto. The two or more of electrode pads 5 may be positioned between two of the electrode pads 5 which are configured to have the same electric potential.

Fourth Embodiment

Figure 7:
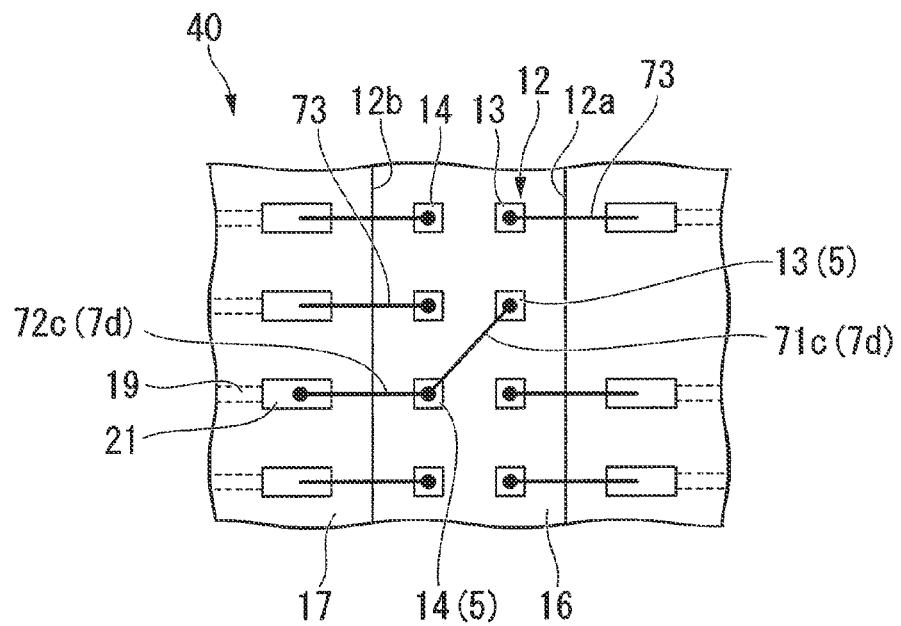
FIG. 7 is a fragmentary plan view illustrating a rear surface of a semiconductor device in accordance with yet another embodiment of the present invention.

FIG. 7 is a fragmentary plan view illustrating a rear surface of a semiconductor device in accordance with the fourth embodiment of the present invention.

A semiconductor device 40 illustrated in FIG. 7 is different from the semiconductor device 10 illustrated in FIG. 1 on the following elements. Two or more of the electrode pad 5 are configured to have the same electric potential and include the first and second electrode pads 13 and 14 in a similar way to the semiconductor device 10 illustrated FIG. 1. However, the first electrode pad 13 is not the closest to the second electrode pad 14 but the second-closest. The first and second electrode pads 13 and 14 are connected by a first wire 71c. The first wire 71c is extended in a direction crossing the first and second side walls 12a and 12b. The first wire 71c is oblique to the second wire 72c when the wiring board 17 is seen in a vertical direction.

The same parts as those of the semiconductor device 10 in the first embodiment are denoted by the same reference numerals in the drawings and their descriptions are omitted. The semiconductor device 40 illustrated in FIG. 7 can be formed in the same manner as the semiconductor device 10 illustrated in FIG. 1.

The semiconductor device 40 illustrated in FIG. 7 may include, but is not limited to, a connector 7d including the first and second wires 71c and 72c. The connector 7d including the first and second wires 71c and 72c connects two or more of the electrode pad 5 which are configured to have the same electric potential and the bonding pad 21 in a similar way as the semiconductor device 10 illustrated in FIG. 1. The bonding pad 21 is located at the first end of the wiring layer 19 arranged over the wring board 17. The number of the wiring layers 19 with respect to the number of the electrode pads 5 can be reduced. A similar effect as the semiconductor device 10 illustrated in FIG. 1 can be obtained.

Fifth Embodiment

Figure 8:
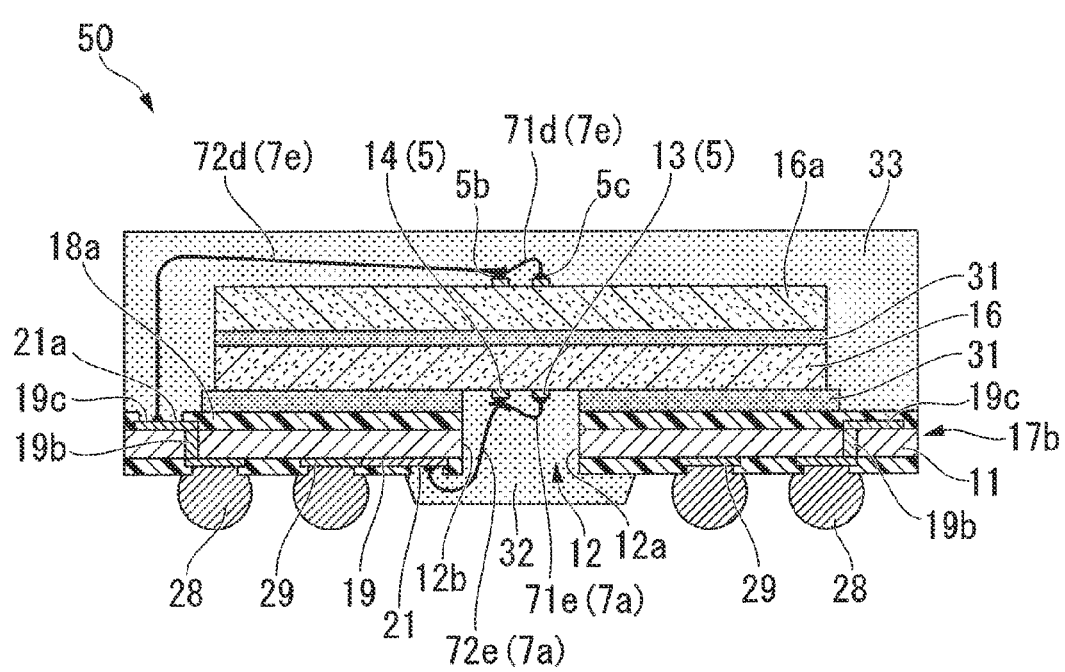
FIG. 8 is a cross sectional elevation view illustrating a rear surface of a semiconductor device in accordance with yet still another embodiment of the present invention.

FIG. 8 is a cross sectional elevation view illustrating a rear surface of a semiconductor device in accordance with the fifth embodiment of the present invention.

A semiconductor device 50 illustrated FIG. 8 is different from the semiconductor device 10 illustrated in FIG. 1 on the following elements. A second semiconductor chip 16a is provided over a first semiconductor chip 16. The first semiconductor chip 16 is positioned between the second semiconductor chip 16a and the wiring board 17b. An electrode pad group is provided over a surface of the second semiconductor chip 16a, which is opposed to a surface facing toward the first semiconductor chip 16. The electrode pad group includes electrode pads 5b and 5c which are configured to have the same electric potential. The electrode pads 5b and 5c which are configured to have the same electric potential are electrically connected to a bonding pad 21a via a second connector 7e. The second connector 7e includes first and second wires 71d and 72d. The bonding pad 21a is located at a first end of a wiring layer 19c. The bonding pad 21a is connected to the wiring layer 19c. The bonding pad 21a is uncovered by an insulating film 18a over a wiring board 17b.

The same parts as those of the semiconductor device 10 in the first embodiment are denoted by the same reference numerals in the drawings and their descriptions are omitted.

The wiring board 17b included in the semiconductor device 50 illustrated in FIG. 8 is a multilayer wiring board. The wiring board 17b may include, but is not limited to, a double-layer wiring including the wiring layers 19c and 19. The wiring layer 19c is provided on a first surface of the insulating substrate 11. The wiring layer 19 is provided on a second surface of the insulating substrate 11.

On the wiring board 17b, the wiring layer 19c provided on the second surface of the insulating substrate 11 is partially covered with insulating film 18a. The insulating film 18a includes a solder resist or the like. The wiring layer 19c is connected to the land 29 through the contact 19b penetrating the wiring board 17b and the wiring layer 19 provided on the second surface of the insulating substrate 11. The bonding pad 21a (bond finger) is provided on the first surface of the wiring board 17b. The bonding pad 21a is provided in a frame of the wiring board 17b which does not overlap with the first and second semiconductor chips 16 and 16a seen when the wiring board 17b is seen in a vertical direction. The bonding pad 21a (bond finger) is located at the first end of the wiring layer 19c, which is uncovered by the insulating film 18a over a wiring board 17b.

The second semiconductor chip 16a included in the semiconductor device 50 illustrated in FIG. 8 is mounted on the first semiconductor chip 16 using a fixing member 31 such as the DAF (Die Attached Film). The second semiconductor chip 16a is mounted on a first surface of the first semiconductor chip 16, which is opposed to a second surface of the first semiconductor chip 16 facing toward the wiring board 17b. The electrode pads 5b and 5c which are configured to have the same electric potential are provided on a first surface of the second semiconductor chip 16a opposed to a second surface of the second semiconductor chip 16a facing toward the semiconductor chip 16. The electrode pads 5b and 5c are connected to the second connector 7e including the first and second wires 71d and 72d. The electrode pads 5b and 5c are connected to a power supply or are grounded.

As shown in FIG. 8, the electrode pads 5b and 5c on the second semiconductor chip 16a are electrically connected to each other via the first wire 71d. The bonding pad 21a and the electrode pad 5b are electrically connected to each other via the second wire 72d. The bonding pad 21a is located at the first end of the wiring layer 19c over the first surface of the wiring board 17b. The bonding pad 21a is connected to the wiring layer 19c. An end of the second wire 72d is connected to the electrode pad 5b via a bump.

The electrode pad 5c connected to the end of the second connector 7e is farther from the bonding pad 21a located at the first end of the wiring layer 19c than the electrode pad 5b connected to the second connector 7e. The electrode pad 5c is provided on the second semiconductor chip 16a.

As shown in FIG. 8, the distance between the electrode pad 5c connected to the end of the second connector 7e and the bonding pad 21a adjacent to the electrode pad 5c is longer than the distance from the electrode pad 5c and the electrode pad 5b which is connected to the electrode pad 5c via the first wire 71d of the second connector 7e.

In the process for mounting the first semiconductor chip 16, the semiconductor device 50 illustrated in FIG. 8 can be formed in the same manner as the semiconductor device 10 illustrated in FIG. 1 except the following processes. The second semiconductor chip 16a is fixed on the first surface of the first semiconductor chip 16 by the fixing member 31. The first surface of the first semiconductor chip 16 is opposed to the second surface of the first semiconductor chip 16, which faces toward the wiring board 17. The second semiconductor chip 16a is provided with the electrode pad group including the electrode pads 5b and 5c which are configured to have the same electric potential. In the connection process, the electrode pads 5b and 5c which are configured to have the same electric potential are electrically connected to the bonding pad 21a via the second connector 7e before or after two or more of the electrode pads 5 which are configured to have the same electric potential are electrically connected to the bonding pad 21 via the connector 7a. The bonding pad 21a is located at the first end of the wiring layer 19c, which is uncovered by the insulating film 18a on the wiring board 17b. The second connector 7e includes the first and second wires 71d and 72d.

The semiconductor device 50 illustrated in FIG. 8 may include, but is not limited to, the connector 7a which connects two or more of the electrode pads 5 and the first end of the wiring layer 19. Two or more of the electrode pads 5 are configured to have the same electric potential. The wiring layer 19 is provided on the second surface of the wiring board 17b. The semiconductor device 50 may further include, but is not limited to, the second connector 7e which connects two or more of the electrode pads 5b and 5c and the first end of the wiring layer 19c. Two or more of the electrode pads 5b and 5c are configured to have the same electric potential. The wiring layer 19c is provided on the first surface of the wiring board 17b. The second connector 7e includes the first and second wires 71d and 72d. The number of the wiring layers 19 and 19c with respect to the number of the electrode pads 5 can be reduced. A similar effect as the semiconductor device 10 illustrated in FIG. 1 can be obtained.

The semiconductor device 50 illustrated in FIG. 8 may include, but is not limited to, the wiring board 17b which is a multilayer wiring board. The wiring board 17b may include, but is not limited to, a double-layer wiring including the wiring layers 19c and 19. The wiring layer 19c is provided on the first surface of the insulating substrate 11. The wiring layer 19 is provided on the second surface of the insulating substrate 11. The first and second semiconductor chips 16 and 16a are stacked over the wiring board 17b. The semiconductor device with high capacity and high functionality can be achieved.

According to the above described embodiments, the semiconductor devices 10, 20, 30, and 40 are shown including the semiconductor chip 16 on the wiring board 17, for example. However, the semiconductor devices 10, 20, 30, and 40 may include a plurality of semiconductor chips over the wiring board 17.

According to the above described embodiments, the semiconductor devices 10, 20, 30, and 40 are shown including the wiring board 17 including the single layer wiring as the wiring layer 19 formed on the second surface 11b of the insulating substrate 11, for example. However, the semiconductor devices 10, 20, 30, and 40 may include a multilayer wiring board including a double-layer wiring or multilayer wiring as the wiring board 17.

According to the above described embodiments, the semiconductor devices 10, 20, 30, 40, and 50 are shown including the wiring board 17 (or 17b) having the opening 12 substantially at the center, but is not limited thereto. The position of the opening 12 may not be center of the wiring board 17 (or 17b). A wiring board which is separated in two pieces can be used as the wiring board 17 (or 17b).

According to the above described embodiments, BGA type semiconductor device is shown, for example. However, the present embodiment can be applied to LGA (Land Grid Array) type semiconductor devices. In this case, the land 29 functions as the external electrode.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A device comprising:
a substrate including a bonding pad thereon;
a semiconductor chip including first and second electrode pads formed on a surface of the semiconductor chip, the semiconductor chip being mounted over the substrate;
an opening in the substrate, the first and second electrode pads facing the opening;
a first connector electrically coupling the first electrode pad to the second electrode pad; and
a second connector including a first end that is bonded above the bonding pad on the substrate and a second end that is bonded above the first electrode pad.

2. The device as claimed in claim 1, further comprising:
a second semiconductor chip stacked over the semiconductor chip, the semiconductor chip being between the substrate and the second semiconductor chip.

3. The device as claimed in claim 2, wherein:
the substrate includes a second bonding pad thereon, the second semiconductor chip includes third and fourth electrode pads formed on a second surface;
a third connector electrically couples the third electrode pad to the fourth electrode pad, the third connector being in contact with the third and fourth electrode pads; and
a fourth connector includes a third end that is bonded above the second bonding pad on the substrate and a second end that is bonded above the third electrode pad.

4. The device as claimed in claim 1, wherein the substrate includes an upper surface, a lower surface opposite to the upper surface and the opening penetrates from the upper surface to the lower surface, the bonding pad is formed on the lower surface, the second bonding pad is formed on the upper surface, and
the second connector electrically couples the bonding pad to the first electrode pad, the second connector passing through the opening.

5. The device as claimed in claim 1, further comprising:
a sealing resin covering the semiconductor chip, and the first connector and the second connector being embedded in the sealing resin.

6. The device as claimed in claim 1, wherein the semiconductor chip includes a fifth electrode pad formed on the surface thereof, the fifth electrode pad is arranged between the first and second electrode pads without electrically coupling to the first connector.

7. The device as claimed in claim 1, wherein the first and second electrode pads are arranged in line along a first direction,
the second connector is extending in a second direction that is crossing to the first direction.

8. The device as claimed in claim 1, further comprising:
a bump provided above the first electrode pad of the semiconductor chip, the second connector being electrically coupled to the first electrode pad via the bump.

9. A device comprising:
a substrate including a plurality of bonding pads thereon;
a semiconductor chip including a first surface defined by first and second edges opposite to each other and by third and fourth edges opposite to each other and a plurality of electrode pads formed on the first surface, the electrode pads being aligned in two lines that are in parallel with the third edge, the electrode pads including first and second electrode pads;
an opening in the substrate, the first and second electrode pads facing the opening;
a first wire electrically coupling the first electrode pad to the second electrode pad; and
a second wire electrically coupling the first electrode pad to a corresponding one of the bonding pads on the substrate, the second wire is extended from the corresponding one of the bonding pads, passing through the opening, and terminating above the first electrode pad.

10. The device as claimed in claim 9, wherein the substrate includes a second bonding pad thereon, the device further comprises:
a second semiconductor chip including third and fourth electrode pads formed on a second surface, the semiconductor chip being provided between the substrate and the second semiconductor chip;
a third wire electrically coupling the third electrode pad to the fourth electrode pad; and a fourth wire electrically coupling the third electrode pad to the second bonding pad of the substrate.

11. The device as claimed in claim 10, wherein the substrate includes an upper surface, a lower surface opposite to the upper surface and wherein the opening penetrates from the upper surface to the lower surface, the bonding pad is formed on the lower surface, and
a fourth wire electrically couples the third electrode pad to the second bonding pad.

12. The device as claimed in claim 9, further comprising:
a sealing resin covering the semiconductor chip, and the first wire and the second wire being embedded in the sealing resin.

13. The device as claimed in claim 9, wherein the semiconductor chip includes a fifth electrode pad formed on the first surface thereof, the fifth electrode pad is arranged between the first and second electrode pads without electrically coupling to the first wire.

14. The device as claimed in claim 9, wherein the first and second electrode pads are arranged in line along a first direction, and
the second connector is extending in a second direction that is crossing to the first direction.

15. A device comprising:
a substrate including first and second bonding pads thereon;
a first semiconductor chip including first and second electrode pads formed on a first surface of the semiconductor chip, the first semiconductor chip being mounted over the substrate;
an opening in the substrate, the first and second electrode pads facing the opening;
a first connector electrically coupling the first electrode pad to the second electrode pad;
a second connector including a first end that is bonded above the first bonding pad on the substrate and a second end that is bonded above the first electrode pad via the first connector;
a second semiconductor chip including third and fourth electrode pads formed on a second surface, the second semiconductor chip being stacked over the first semiconductor chip;
a third connector electrically coupling the third electrode pad to the fourth electrode pad, the third connector being in contact with the top surfaces of the third and fourth electrode pads; and
a fourth connector including a third end that is bonded above the second bonding pad and a fourth end that is bonded above the third electrode pad via the third connector.

16. The device as claimed in claim 15, wherein the substrate includes an upper surface, a lower surface opposite to the upper surface and the opening penetrates from the upper surface to the lower surface, the first bonding pad is arranged on the lower surface, the second bonding pad is arranged on the upper surface, and
the second connector electrically couples the first electrode pad to the first bonding pad through the opening.

17. The device as claimed in claim 15, further comprising:
a bump provided above the first electrode pad of the semiconductor chip, the second connector electrically couples the first electrode pad via the bump.

* * * * *